(12) United States Patent
Nomura

(10) Patent No.: US 9,336,980 B2
(45) Date of Patent: May 10, 2016

(54) ELECTRON BEAM WRITING APPARATUS, AND METHOD FOR ADJUSTING CONVERGENCE HALF ANGLE OF ELECTRON BEAM

(71) Applicant: NuFlare Technology, Inc., Yokohama (JP)

(72) Inventor: Haruyuki Nomura, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/663,971

(22) Filed: Mar. 20, 2015

(65) Prior Publication Data
US 2015/0303026 A1  Oct. 22, 2015

(30) Foreign Application Priority Data
Apr. 16, 2014 (JP) ................... 2014-085050

(51) Int. Cl.
*H01J 37/10* (2006.01)
*H01J 37/147* (2006.01)
*H01J 37/04* (2006.01)

(52) U.S. Cl.
CPC .......... *H01J 37/1471* (2013.01); *H01J 37/045* (2013.01); *H01J 37/10* (2013.01); *H01J 2237/043* (2013.01); *H01J 2237/063* (2013.01); *H01J 2237/1502* (2013.01)

(58) Field of Classification Search
CPC ..... H01J 37/1471; H01J 37/045; H01J 37/10; H01J 2237/1502; H01J 2237/063; H01J 2237/043

USPC ................ 250/396 R, 492.1–492.3
See application file for complete search history.

(56) References Cited

U.S. PATENT DOCUMENTS

| 6,670,620 B1 * | 12/2003 | Okunuki | H01J 37/063 |
| | | | 250/398 |
| 2006/0071175 A1 * | 4/2006 | Kim | H01J 3/028 |
| | | | 250/396 R |

FOREIGN PATENT DOCUMENTS

| JP | 2000-182550 | 6/2000 |
| JP | 2004-47766 | 2/2004 |

* cited by examiner

*Primary Examiner* — Michael Maskell
(74) *Attorney, Agent, or Firm* — Oblon, McClelland, Maier & Neustadt, L.L.P.

(57) ABSTRACT

An electron beam writing apparatus includes an electron gun system to emit an electron beam, a height adjustment unit, arranged at the downstream side compared to the electron gun system with respect to the optical axis direction, to variably adjust a height position of the electron gun system, an electron lens, arranged at the downstream side compared to the height adjustment unit with respect to the optical axis direction, to converge the electron beam, a lens control unit to control, for each variably adjusted and changed height position of the electron gun system, the electron lens such that the electron beam forms a crossover at a predetermined position, and an objective lens, arranged at the downstream side compared to the electron lens with respect to the optical axis direction, to focus the electron beam having passed the electron lens.

10 Claims, 9 Drawing Sheets

ELECTRON BEAM WRITING APPARATUS, AND METHOD FOR ADJUSTING CONVERGENCE HALF ANGLE OF ELECTRON BEAM

CROSS-REFERENCE TO RELATED APPLICATION

This application is based upon and claims the benefit of priority from the prior Japanese Patent Application No. 2014-085050 filed on Apr. 16, 2014 in Japan, the entire contents of which are incorporated herein by reference.

BACKGROUND OF THE INVENTION

1. Field of the Invention

Embodiments of the present invention relate generally to an electron beam writing apparatus and a method for adjusting an electron beam convergence half angle. More specifically, for example, the embodiments relate to a method for adjusting a convergence half angle of an electron beam in the electron beam writing apparatus that emits an electron beam onto a target object.

2. Description of Related Art

In recent years, with high integration of LSI, the line width (critical dimension) required for circuits of semiconductor devices is becoming progressively narrower. As a method for forming an exposure mask (also called reticle) used to form circuit patterns in these semiconductor devices, the electron beam (EB) writing technique having excellent resolution is employed.

FIG. 10 is a conceptual diagram explaining operations, of a variable shaped electron beam writing or "drawing" apparatus. The variable shaped electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In electron beam writing, importance is attached to the throughput, in manufacturing a mask. On the other hand, importance is attached to the resolution of beams, in performing various evaluation to develop next-generation lithography, because finer pattern formation is requested therefor.

In terms of attaching importance to the throughput, if luminance of the cathode of an electron gun is increased, cathode conditions such as a crossover radius of an electron beam immediately after discharge of the cathode may change, resulting in degradation of resolution.

On the other hand, the resolution depends upon the electron optical aberration, and the electron optical aberration is proportional to the power (exponentiation) of the convergence half angle. The convergence half angle depends upon the crossover radius of an electron beam. Therefore, in terms of attaching importance to the resolution, in order to reduce a convergence half angle, it is examined to decrease the crossover radius of a beam by focusing electron beams emitted from the electron gun while strengthening the excitation of the illumination lens.

Then, although it is necessary to increase the excitation of the illumination lens as much as possible for reducing the convergence half angle, there is a limit in increasing a magnetic flux density due to magnetic saturation, etc. of pole piece material used for the illumination lens. Therefore, there is also a limit in increasing the excitation of the illumination lens in accordance with the limit of the magnetic flux density. Accordingly, there is also a limit in focusing an electron beam by controlling the illumination lens, and thus, there is also a limit in reducing the convergence half angle. As a result, there is a problem in that resolution needed for development of next-generation lithography may not be acquired. 7

Furthermore, if a convergence half angle is made small, the current density of a beam is also made small. Then, if the current density is decreased, writing time needs to be long, and thus resulting in a problem that the throughput degrades.

Regarding this, there is disclosed a technique for changing beam crossover characteristics by using a plurality of accelerating electrodes (refer to, e.g., Japanese Published Unexamined Patent Application (JP-A) No. 2000-182550).

BRIEF SUMMARY OF THE INVENTION

According to one aspect of the present invention, an electron beam writing apparatus includes an electron gun system configured to emit an electron beam, a height adjustment unit arranged at a downstream side compared to the electron gun system with respect to an optical axis direction and configured to variably adjust a height position of the electron gun system, an electron lens arranged at the downstream side compared to the height adjustment unit with respect to the optical axis direction and configured to converge the electron beam, a lens control unit configured to control, for each variably adjusted and changed height position of the electron gun system, the electron lens such that the electron beam forms a crossover at a predetermined position, and an objective lens arranged at the downstream side compared to the electron lens with respect to the optical axis direction and configured to focus the electron beam having passed the electron lens.

According to another aspect of the present invention, a method for adjusting a convergence half angle of an electron beam includes changing a height position of an electron gun system that emits an electron beam, and adjusting a crossover height position of the electron beam emitted from the electron gun system and having passed through the electron lens to be a crossover height position of an electron beam before changing the height position of the electron gun system.

Moreover, according to another aspect of the present invention, a method for adjusting a convergence half angle of an electron beam includes adjusting a height position of an electron gun system that emits an electron beam to be a first position when a first writing mode is selected, adjusting a crossover height position of the electron beam emitted from the electron gun system and having passed through an electron lens to be a second position when the first writing mode is selected, adjusting the height position of the electron gun system to be a third position higher than the first position with respect to an optical axis direction when the first writing mode is switched to a second writing mode, and making an adjustment to maintain the crossover height position of the electron beam emitted from the electron gun system and having passed through the electron lens to be the second position when the second writing mode is selected.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Moreover, a variable shaped electron beam writing apparatus will be described as an example of a charged particle beam apparatus.

The following embodiments aim to provide an apparatus and method that can improve the resolution higher than the conventional one. Moreover, at least one of embodiments of the present invention describes an apparatus and method that can perform writing processing putting importance on throughput and writing processing putting importance on resolution.

First Embodiment

Figure 1:
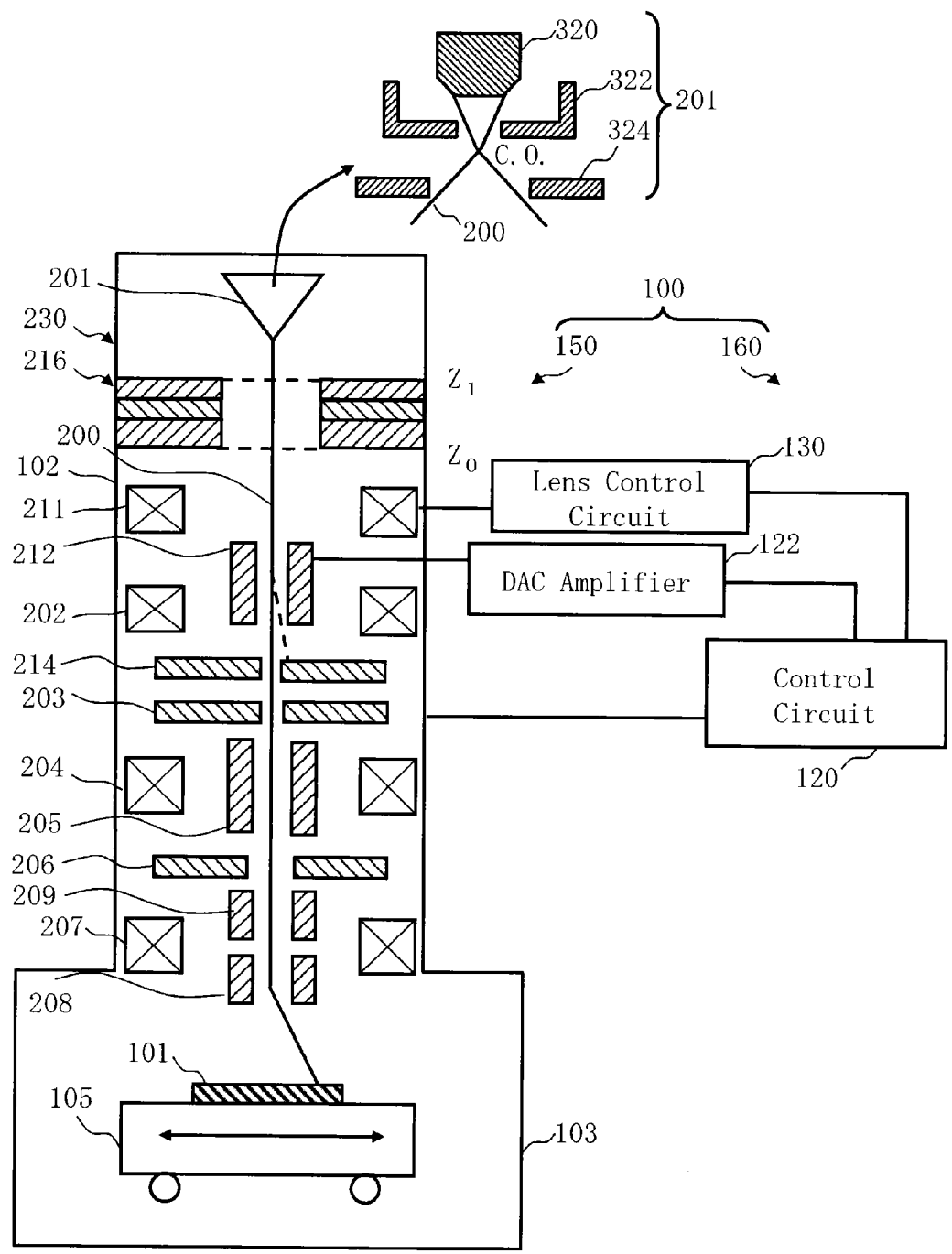
FIG. 1 is a schematic diagram showing a configuration of a writing apparatus according to a first embodiment.

FIG. 1 is a schematic diagram showing a configuration of a writing apparatus according to the first embodiment. As shown in FIG. 1, a writing (or "drawing") apparatus 100 includes a writing unit 150 and a control unit 160. The writing apparatus 100 is an example of a charged particle beam writing apparatus. Particularly, it is an example of a variable shaped electron beam writing apparatus. The writing unit 150 includes an electron gun system 230, a height adjustment mechanism 216, an electron optical column 102 and a writing chamber 103. An electron gun 201 is arranged in the electron gun system 230. In the electron optical column 102, there are arranged an electron lens 211, an illumination lens 202, a blanking deflector 212, a blanking aperture plate 214, a first aperture plate 203, a projection lens 204, a deflector 205, a second aperture plate 206, an objective lens 207, a main deflector 208 and a sub deflector 209. In the writing chamber 103, there is arranged an XY stage 105. On the XY stage 105, a target object or "sample" 101 such as a mask serving as a writing target is placed when writing is performed. The target object 101 is, for example, an exposure mask used for manufacturing semiconductor devices. The target object 101 may be, for example, a mask blank on which resist has been applied and a pattern has not yet been formed. As the blanking deflector 212, one pair of electrodes is used, for example.

The height adjustment mechanism 216 (height adjustment unit) is arranged at the target object side (hereinafter called the downstream side), compared with the electron gun frame 230, with respect to the direction of the optical axis, and variably adjusts the height position of the electron gun frame 230. The electron optical column 102 is arranged at the downstream side compared to the height adjustment mechanism 216, with respect to the optical axis direction. That is, the electron lens 211, the illumination lens 202, the blanking deflector 212, the blanking aperture plate 214, the first aperture plate 203, the projection lens 204, the deflector 205, the second aperture plate 206, the objective lens 207, the main deflector 208, and the sub deflector 209 are arranged at the downstream side compared to the height adjustment mechanism 216, with respect to the optical direction. The electron lens 211 is arranged between the height adjustment mechanism 216 and the blanking deflector 212. In other words, the height adjustment unit 216 is arranged on the electron optical column 102. The height adjustment unit 216 supports the electron gun system 230.

The electron gun 201 includes a cathode 320, a Wehnelt 322, and an anode 324. It is preferable to use, for example, lanthanum hexaboride ($LaB_6$) crystal, etc. as the cathode 320. The Wehnelt 322 is arranged between the cathode 320 and the anode 324. The anode 324 is grounded, and the electric potential is set to a grand potential. A power supply unit (not shown) for the electron gun is connected to the electron gun 201. The height adjustment mechanism 216 is arranged between the electron gun system 230 and the electron optical column 102.

The control unit 160 includes a control circuit 120, a DAC (digital-analog converter) amplifier 122, and a lens control circuit 130.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection. Input devices, such as a mouse and a keyboard, a monitoring device, and the like may be connected to the writing apparatus 100. In the example of FIG. 1, although the blanking aperture plate 214 is arranged at the upper stream side compared to the first aperture plate 203, it is not limited thereto, and any position will do as long as the blanking operation can be performed. For example, the blanking aperture plate 214 may be arranged at the downstream side compared to the first aperture plate 203 or the second aperture plate 206.

Figure 2:
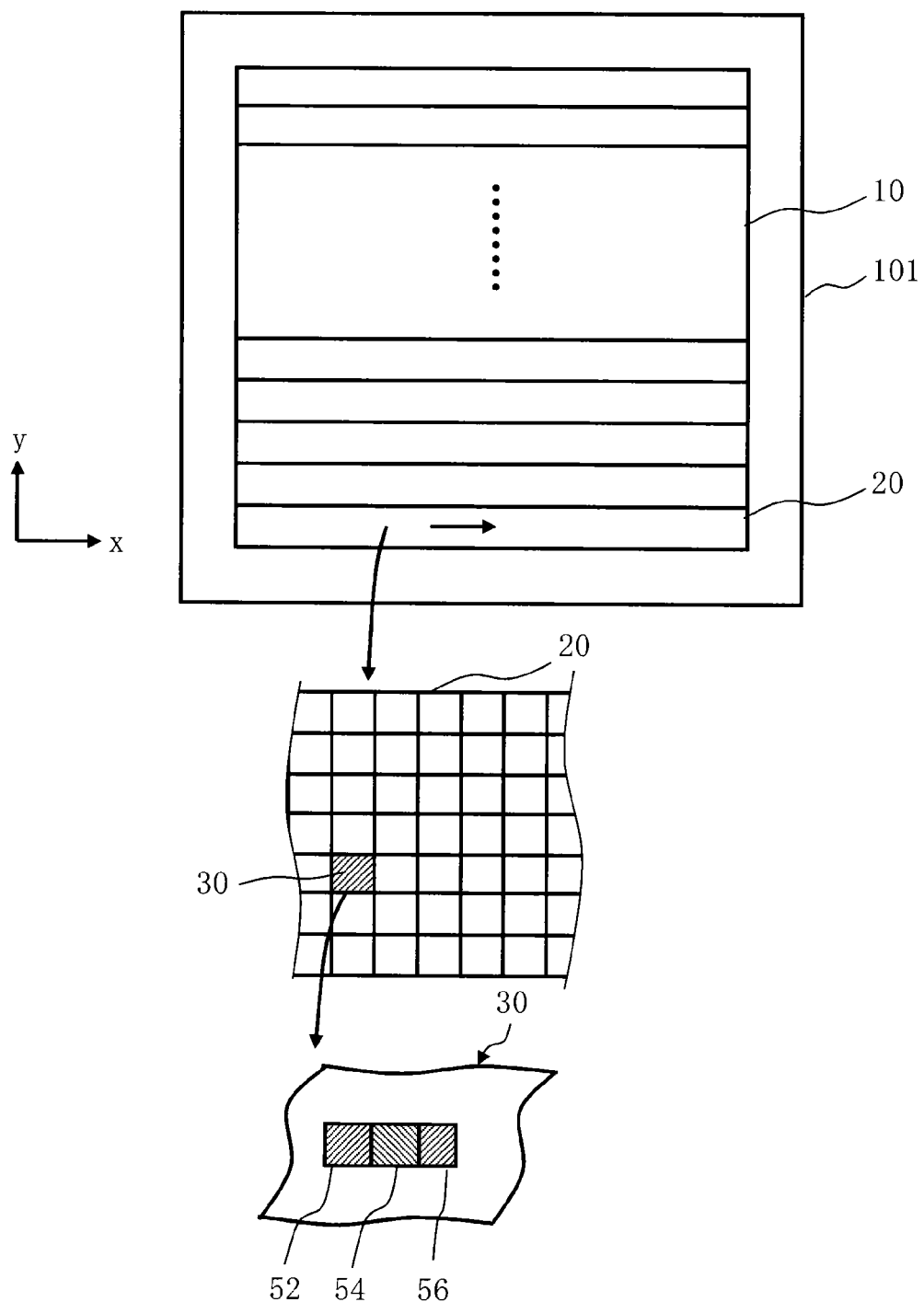
FIG. 2 is a conceptual diagram for explaining each region according to the first Embodiment.

FIG. 2 is a conceptual diagram for explaining each region according to the first Embodiment. In FIG. 2, a writing region 10 of the target object 101 is virtually divided into a plurality of stripe regions 20 each being in a strip shape and each having a width deflectable in the y direction by the main deflector 208. Further, each of the stripe regions 20 is virtually divided into a plurality of subfields (SFs) 30 (small regions) each having a size deflectable by the sub deflector 209. Shot FIGS. 52, 54, and 56 are written at corresponding shot positions in each SF 30.

A digital signal for blanking control is output from the control circuit 120 to the DAC amplifier 122 for blanking control. Then, in the DAC amplifier 122 for blanking control, the digital signal is converted to an analog signal, and amplified to be applied as a deflection voltage to the blanking deflector 212. An electron beam 200 is deflected by this deflection voltage in order to control the irradiation time (irradiation amount) of each shot.

A digital signal for main deflection control is output from the control circuit 120 to a DAC amplifier (not shown). Then, in the DAC amplifier for main deflection control, the digital signal is converted to an analog signal and amplified to be applied as a deflection voltage to the main deflector 208. By this deflection voltage, the electron beam 200 is deflected, and thereby each beam shot is deflected to a reference position in a target SF 30 in the virtually divided mesh like SFs.

A digital signal for sub deflection control is output from the control circuit 120 to a DAC amplifier (not shown). Then, in the DAC amplifier for sub deflection control, the digital signal is converted to an analog signal and amplified to be applied as a deflection voltage to the sub deflector 209. The electron beam 200 is deflected by this deflection voltage, and thereby each beam shot is deflected to each shot position in a target SF 30.

The writing apparatus 100 performs writing processing in each stripe region 20 by using a multiple stage deflector of a plurality of stages. Here, as an example, a two-stage deflector composed of the main deflector 208 and the sub deflector 209 is used. While the XY stage 105 is continuously moving in the −x direction, for example, a pattern is written in the x direction in the first stripe region 20. After the pattern writing in the first stripe region 20 has been completed, a pattern is written in the second stripe region 20 in the same or opposite direction. Then, in the same way, patterns are written in the third and subsequent stripe regions 20. The main deflector 208 deflects the electron beam 200 in sequence to a reference position of the SF 30 so as to follow the movement of the XY stage 105. The sub deflector 209 deflects the electron beam 200 from the reference position of each SF 30 to each shot position of an irradiating beam in the SF 30 concerned. Thus, the sizes of the deflection regions of the main deflector 208 and the sub deflector 209 are different from each other. The SF 30 is the smallest deflection region in the deflection regions of the multiple stage deflector.

If the cathode 320 is heated in the state in which a negative acceleration voltage is applied to the cathode 320 and a negative bias voltage is applied to the Wehnelt 322, electrons (electron group) are emitted from the cathode 320 and the emitted electrons (electron group) are spread after (cathode crossover) forming a convergence point (crossover: C.O.) and accelerated by the acceleration voltage to become an electron beam advancing toward an anode 324. Then, the electron beam passes through an opening in the anode 324, thereby, the electron beam 200 is emitted from the electron gun 201.

The electron beam 200 emitted from the electron gun 201 (an emission unit) is converged by the electron lens 211 at the central height position (an example of a predetermined position) in the blanking deflector 212, for example, and a convergence point (crossover: C.O.) is formed. Then, when passing through the blanking deflector 212 which is arranged at the downstream side compared to the electron lens 211 with respect to the direction of the optical axis, beam-on or beam-off is controlled by the blanking deflector 212 controlled by a deflection signal from the DAC amplifier 122 for blanking. In other words, when performing blanking control of switching between beam-on and beam-off, the blanking deflector 212 deflects the electron beam. The electron beam having been deflected to be in a beam-off state is blocked by the blanking aperture plate 214 (blanking aperture member) arranged at the downstream side compared to the blanking deflector 212 with respect to the direction of the optical axis. That is, when in the beam-on state, it is controlled to pass through the blanking aperture plate 214, and when in the beam-off state, it is deflected such that the entire beam is blocked by the blanking aperture plate 214. The electron beam 200 that has passed through the blanking aperture plate 214 during the period from becoming a beam-on state from a beam-off state to again becoming a beam-off state serves as one shot of the electron beam. The blanking deflector 212 controls the direction of the passing electron beam 200 to alternately generate a beam-on state and a beam-off state. For example, when in a beam-on state, a voltage of 0V (or not to apply any voltage) is applied to the blanking deflector 212, and, when in a beam-off state, a voltage of several V is applied to it. The dose per shot of the electron beam 200 to irradiate the target object 101 is adjusted depending upon an irradiation time t of each shot.

As described above, each shot of the electron beam 200, generated by passing through the blanking deflector 212 and the blanking aperture plate 214, irradiates the whole of the first shaping aperture plate 203 which has a quadrangular opening by the illumination lens 202. At this stage, the electron beam 200 is first shaped to a quadrangle. Then, after passing through the first shaping aperture plate 203, the electron beam 200 of the first aperture image is projected onto the second shaping aperture plate 206 by the projection lens 204. The first aperture image on the second shaping aperture plate 206 is deflection-controlled by the deflector 205 so as to change (variably shape) the shape and size of the beam. Such variable beam shaping is performed for each shot, and, generally, each shot is shaped to have a different shape and size. Then, after passing through the second shaping aperture plate 206, the electron beam 200 of the second aperture image is focused by the objective lens 207, and deflected by the main deflector 208 and the sub deflector 209 to reach a desired position on the target object 101 placed on the XY stage 105 which moves continuously. In other words, an electron beam in a beam-on state is focused onto the target object 101 by the objective lens 207 which is arranged at the downstream side compared to the blanking aperture plate 214 with respect to the direction of the optical axis. FIG. 1 shows the case of using multiple stage deflection of the main and sub deflection for position deflection. In such a case, the main deflector 208 may deflect the electron beam 200 of a shot concerned to a reference position in an SF 30 while following the movement of the stage, and the sub deflector 209 may deflect the beam of the shot concerned to each irradiation position in the SF. A figure pattern defined in writing data is written by repeating such operations and combining a shot figure of each shot.

Figures 3A, 3B:
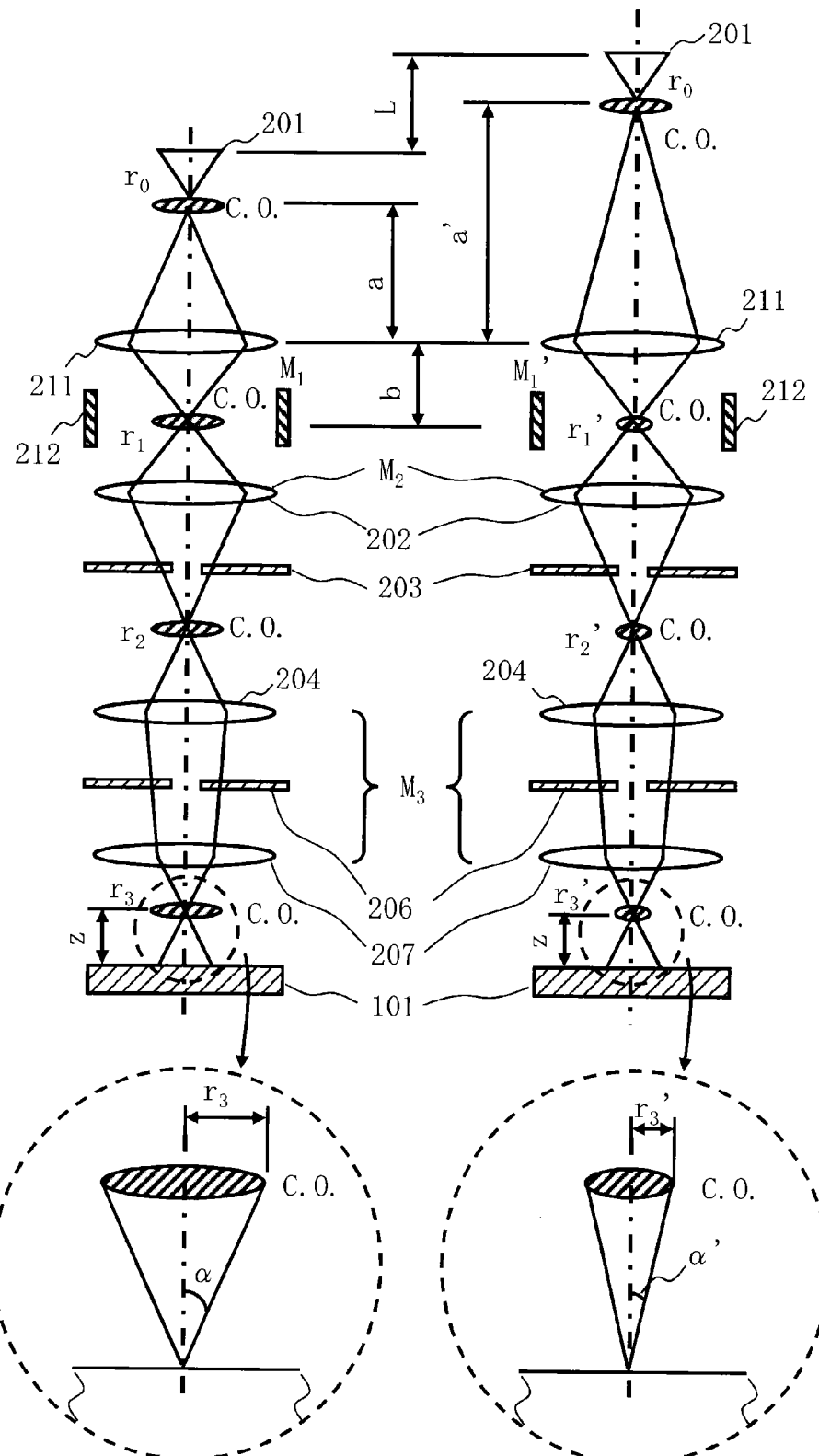
FIG. 3A and FIG. 3B illustrate an optical trajectory and a convergence half angle in a crossover system according to the first embodiment.

FIG. 3A and FIG. 3B illustrate an optical trajectory and a convergence half angle in the crossover system according to the first embodiment. FIG. 3A shows an optical trajectory in the crossover in a writing mode 1 (first writing mode) putting emphasis on the throughput. FIG. 3B shows an optical trajectory in the crossover in a writing mode 2 (second writing mode) putting emphasis on the resolution. In the writing mode 1 of FIG. 3A and the writing mode 2 of FIG. 3B, their height positions of the electron gun 201 are different from each other. The arrangement relation concerning other structure elements is the same. FIGS. 3A and 3B show the states each in a beam-on state in blanking control.

In FIG. 3A, the electron beam 200, after a cathode crossover (C.O. radius $r_0$) is formed by the electron gun 201 (discharge unit), advances into the electron optical column 201, is converged at the central height position in the blanking deflector 212 by the electron lens 211, and forms a first crossover (C.O. radius $r_1$). The electron beam 200, after the first crossover is formed, is converged at the height position after passing the first shaping aperture plate 203 by the illumination lens 202, and forms a second crossover (C.O. radius $r_2$). The electron beam 200, after the second crossover is formed, is reduced by the reduction optical system composed of the projection lens 204 and the objective lens 207, is converged at the height position (height position z from the surface of the target object 101) between the objective lens 207 and the surface of the target object 101, and forms a third crossover (C.O. radius $r_3$). Then, the electron beam 200, after the third crossover is formed, irradiates the surface of the target object 101. In such a case, the crossover radius in each crossover can be defined as described below.

The crossover radius $r_1$ in the first crossover can be defined by the following equation (1) using a convergence magnification M1 by the electron lens 211.

$$r_1 = r_0 \cdot M1 \quad (1)$$

The magnification M1 can be defined by the following equation (2) using a distance "a" between the cathode crossover position and the magnetic field center height position of the electron lens 211, and a distance "b" between the magnetic field center height position of the electron lens 211 and the first crossover height position.

$$M1 = b/a \quad (2)$$

The crossover radius $r_2$ in the second crossover can be defined by $r_2 = r_1 \cdot M2$ using a convergence magnification M2 by the illumination lens 202. Similarly, the crossover radius $r_3$ in the third crossover can be defined by $r_3 = r_2 \cdot M3$ using a convergence magnification M3 by the reduction optical system composed of the projection lens 204 and the objective lens 207. Therefore, the crossover radius $r_3$ in the third crossover closest to the surface of the target object 101 can be defined by the following equation (3).

$$r_3 = r_0 \cdot M1 \cdot M2 \cdot M3 = r_0 \cdot (b/a) \cdot M2 \cdot M3 \quad (3)$$

Therefore, an angle (convergence half angle) a obtained by drawing a line from the point where the optical axis intersects the surface of the target object 101 to the edge of the third crossover which is closest to the surface of the target object 101 and by measuring the angle between the line and the optical axis can be defined by the following equation (4).

$$\alpha = \tan^{-1}(r_3/z) \quad (4)$$

The resolution depends upon the electron optical aberration, and the electron optical aberration is proportional to the power (exponentiation) of the convergence half angle. The convergence half angle α depends upon the crossover radius $r_3$ of an electron beam as shown in the equation (4). Therefore, in terms of attaching importance to the resolution, it is important to decrease a crossover radius in order to reduce a convergence half angle. For this purpose, what is necessary is to increase the distance "a" against the distance "b", based on the equation (3).

Then, according to the first embodiment, the height position of the electron gun system 230 is variably adjusted by the height adjustment mechanism 216. In the writing mode 2 putting emphasis on the resolution, as shown in FIG. 3B, the height position of the electron gun 201 is adjusted by the height adjustment mechanism 216 to be higher by a length L than the height position of the electron gun 201 in the writing mode 1 shown in FIG. 3A. However, according to the first embodiment, respective corresponding height positions of the first, second, and third crossovers are adjusted to be the same in FIGS. 3A and 3B in order not to change other optical conditions. Specifically, for each variably adjusted and changed height position of the electron gun system 230, the lens control circuit 130 (lens control unit) controls the electron lens 211 such that the electron beam forms a crossover at the central height position of the blanking deflector 22. Thereby, adjustment of the lenses after the electron lens 211 can be performed in the same conditions.

In FIG. 3B, the electron beam 200, after the cathode crossover (C.O. radius $r_0$) is formed by the electron gun 201 (discharge unit), advances into the electron optical column 201, is converged at the central height position in the blanking deflector 212 by the electron lens 211, and forms a first crossover (C.O. radius $r_1'$). The electron beam 200, after the first crossover is formed, is converged at the height position after passing the first shaping aperture plate 203 by the illumination lens 202, and forms a second crossover (C.O. radius $r_2'$). The electron beam 200, after the second crossover is formed, is reduced by the reduction optical system composed of the projection lens 204 and the objective lens 207, is converged at the height position (height position z from the surface of the target object 101) between the objective lens 207 and the surface of the target object 101, and forms a third crossover (C.O. radius $r_3'$). Then, the electron beam 200, after the third crossover is formed, irradiates the surface of the target object 101. In such a case, the crossover radius in each crossover can be defined as described below.

The crossover radius $r_1'$ in the first crossover can be defined by the following equation (1) using a convergence magnification M1' by the electron lens 211.

$$r_1' = r_0 \cdot M1' \quad (1)$$

Here, the magnification M1' can be defined by the following equation (2) using the distance "a" between the cathode crossover position and the magnetic field center height position of the electron lens 211, and the distance "b" between the magnetic field center height position of the electron lens 211 and the first crossover height position.

$$M1' = b/a' \quad (2)$$

The crossover radius $r_2'$ in the second crossover can be defined by $r_2' = r_1' \cdot M2$ using a convergence magnification M2 by the illumination lens 202. Similarly, the crossover radius $r_3'$ in the third crossover can be defined by $r_3' = r_2' \cdot M3$ using a convergence magnification M3 by the reduction optical system composed of the projection lens 204 and the objective lens 207. Therefore, the crossover radius $r_3'$ in the third crossover closest to the surface of the target object 101 can be defined by the following equation (3).

$$r_3' = r_0 \cdot M1' \cdot M2 \cdot M3 = r_0 \cdot (b/a') \cdot M2 \cdot M3 \quad (3)$$

Therefore, an angle (convergence half angle) α' obtained by drawing a line from the point where the optical axis intersects the surface of the target object 101 to the edge of the third crossover which is closest to the surface of the target object 101 and by measuring the angle between the line and the optical axis can be defined by the following equation (4).

$$\alpha' = \tan^{-1}(r_3'/z) \quad (4)$$

Therefore, by defining that distance a<distance a', it becomes convergence half angle α'<convergence half angle α, and thus, by heightening the height position of the electron gun 201, the convergence half angle can be reduced. Consequently, the electron optical aberration can be reduced and the resolution can be increased.

Figures 4A, 4B:
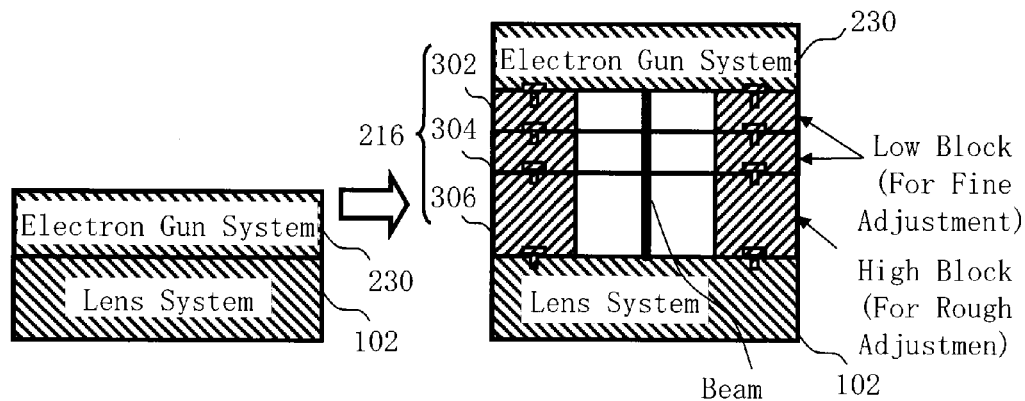
FIGS. 4A and 4B show an example of the structure of a height adjustment mechanism according to the first embodiment.

FIGS. 4A and 4B show an example of the structure of a height adjustment mechanism according to the first embodiment. In FIGS. 4A and 4B, the height adjustment mechanism 216 includes a plurality of spacer members 302, 304, and 306. At the center of each of a plurality of spacer members 302, 304, and 306, an opening for letting an electron beam pass therethrough is formed. It is preferable for the size of the outer diameter of the space members 302, 304, and 306 to be in accordance with the outer diameter of the electron optical column 102. Moreover, air tightness is secured (sealed) by, for example, O-rings, etc. (not shown) between each of a plurality of spacer members 302, 304, and 306, between the spacer member 302 and the electron gun system 230, and between the spacer member 306 and the electron optical column 102. For example, in the writing mode 1, as shown in FIG. 4A, the electron gun system 230 and the electron optical column 102 are directly connected. Alternatively, the electron gun system 230 and the electron optical column 102 are connected interleaving one of a plurality of spacer members 302, 304, and 306. In the writing mode 2, as shown in FIG. 4B, the electron gun system 230 and the electron optical column 102 are connected interleaving a plurality of spacer members 302, 304, and 306. The thicknesses in height of a plurality of spacer members, such as the spacer members 302 and 306, are different from each other. The height adjustment mechanism 216 roughly adjusts the height position of the electron gun system 230 by using the spacer 306 having a large thickness in height, and finely adjust it by using the spacer 302 or 304 having a small thickness in height, for example. However, the structure of the height adjustment mechanism 216 is not limited thereto.

Figures 5A, 5B:
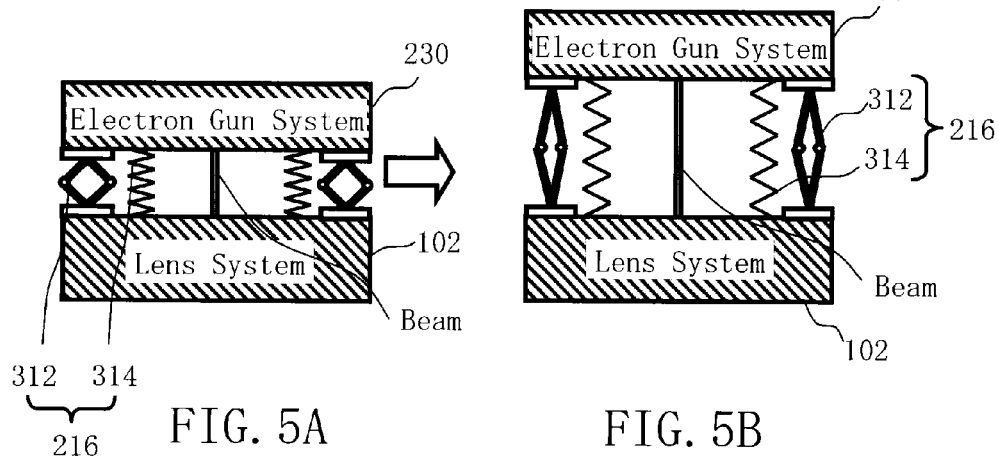
FIGS. 5A and 5B show another example of the height adjustment mechanism according to the first embodiment.

FIGS. 5A and 5B show another example of the height adjustment mechanism according to the first embodiment. In FIGS. 5A and 5B, the height adjustment mechanism 216 includes an elastic piping 314 and an elevating mechanism 312 for elevating the electron gun system 230. Bellows piping etc. is suitable as the piping 314. By connecting the electron gun system 230 and the electron optical column 102 by using the piping 314, the air tightness can be maintained in the electron gun system 230 and the electron optical column 102, thereby maintaining a vacuum state. For example, three elevating mechanisms 312 are arranged at the external side of the piping 314, and support the electron gun system 230 at three points. In the writing mode 1, as shown in FIG. 5A, the height position of the electron gun system 230 can be in the state lowered by the elevating mechanism 312, and in the writing mode 2, as shown in FIG. 5B, the height position of the electron gun system 230 can be in the state raised by the elevating mechanism 312.

The writing method according to the first embodiment executes a mode selection step, a height adjustment step for an electron gun system, a crossover height adjustment step, a mode switching step, a height adjustment step for an electron gun system, and a crossover height adjustment step.

In the mode selection step, one of the writing mode 1 putting emphasis on the throughput and the writing modes 2 putting emphasis on the resolution is selected. Here, the writing mode 1 is selected, for example.

In the height adjustment step for the electron gun system, when the writing mode 1 is selected, the height adjustment mechanism 216 adjusts the height position of the electron gun system 230, which emits the electron beams 200, to be a height position $Z_0$ (first position). For example, the height position of the base of the electron gun system 230 is adjusted to be the height position $Z_0$.

In the crossover height adjustment step, when the writing mode 1 is selected, the lens control circuit 130 adjusts, by using the electron lens 211, the crossover height position of the electron beam 200 emitted from the electron gun system 230 and having passed through the electron lens 211 to be a central height position (second position) of the blanking deflector 212.

In the state described above, writing is performed on a product mask for which the throughput is emphasized, for example. Then, the writing mode is switched in order to perform writing on an evaluation mask for development for which the resolution is emphasized, for example.

In the mode switching step, switching is performed between the writing mode 1 putting emphasis on the throughput and the writing mode 2 putting emphasis on the resolution. Here, the writing mode 1 is switched to the writing mode 2, for example.

In the height adjustment step for the electron gun system, when the writing mode 1 is switched to the writing mode 2 to be selected, the height adjustment mechanism 216 adjusts the height position of the electron gun system 230 to be a height position $Z_1$ (third position) higher than the height position $Z_0$ with respect to the direction of the optical axis. For example, the height position of the base of the electron gun system 230 is adjusted to be the height position $Z_1$. In other words, the height position of the electron gun system 230 which emits electron beams is changed to the height position $Z_1$ from the height position $Z_0$.

In the crossover height adjustment step, when the writing mode 2 is selected, the lens control circuit 130 makes an adjustment, by using the electron lens 211, to maintain the crossover height position of the electron beam 200 emitted from the electron gun system 230 and having passed through the electron lens 211 to be the central height position (second position) of the blanking deflector 212. In other words, the lens control circuit 130 adjusts the crossover height position of the electron beam 200 emitted from the electron gun system 230 and having passed through the electron lens 211 to be the crossover height position of the electron beam 200 before changing the height position of the electron gun system 230.

When performing switching from the writing mode 2 to the writing mode 1, the height position of the electron gun system in the writing mode 2 is adjusted to the height position of the electron gun system in the writing mode 1. Then, the crossover height position of the electron beam 200 having passed through the electron lens 211 should be adjusted to maintain the central height position (second position) of the blanking deflector 212.

Figures 6A, 6B, 6C:
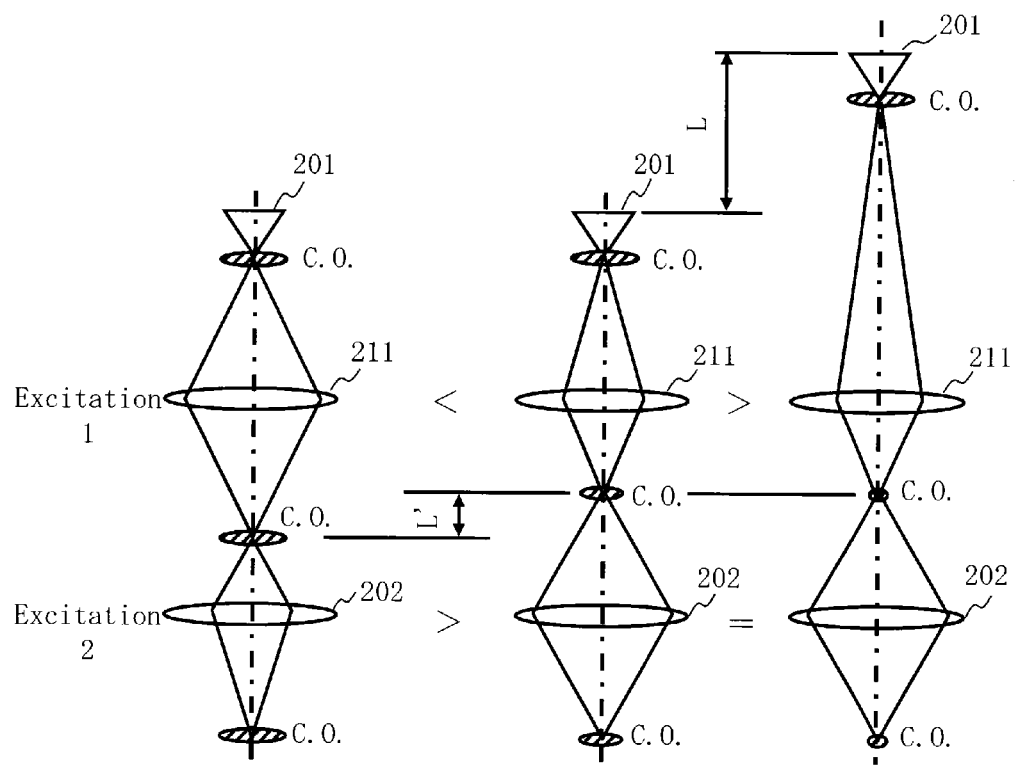
FIGS. 6A to 6C show an example of the relation between a crossover radius and excitation of an electron lens according to the first embodiment.

FIGS. 6A to 6C show an example of the relation between the crossover radius and the excitation of an electron lens according to the first embodiment. FIG. 6A shows an example of the state in which the excitation of the electron lens 211 can be increased. In FIG. 6A, the electron beam 200, after a cathode crossover is formed by the electron gun 201, advances into the electron optical column 201, is converged at a certain height position, and forms the first crossover. The electron beam 200, after the first crossover is formed, is converged at a certain height position by the illumination lens 202, and forms the second crossover. At this stage, in order to reduce a convergence half angle, it is necessary to increase the excitation (excitation 1) of the electron lens 211 as much as possible. Therefore, the excitation (excitation 1) of the electron lens 211 is increased as much as possible. In that case, as shown in FIG. 6B, since the excitation has been increased, the first crossover position after passing through the electron lens 211 is moved to be higher by a height L' with respect to the height direction. By this, the first crossover radius can be made smaller than that of FIG. 6A, and furthermore, the crossover radius of the second and subsequent crossovers can be made smaller than that of FIG. 6A. As a result, the convergence half angle can be made smaller than that of FIG. 6A. When not changing the height position of the second crossover, the excitation (excitation 2) of the illumination lens 202 can be lowered by the operation described above.

However, there is a limit to increase a magnetic flux density due to magnetic saturation, etc. of the pole piece material used for the electron lens 211. Therefore, there is also a limit to increase the excitation of the electron lens 211 in accordance with the limit of magnetic flux density. Accordingly, there is also a limit to focus an electron beam by controlling an illumination lens, and thus, there is also a limit to reduce a convergence half angle.

On the other hand, according to the first embodiment, the height position of the electron gun 201 is made higher than that of FIG. 6B by the height L. When not changing the first crossover position, as shown in FIG. 6C, the excitation (excitation 1) of the electron lens 211 can be lowered by this operation. By this, the first crossover radius can be made smaller than that of FIG. 6B, and furthermore, the crossover radius of the second and subsequent crossovers can be made smaller than that of FIG. 6B. As a result, the convergence half angle can be made smaller than that of FIG. 6B. Moreover, when not changing the height position of the second crossover, the excitation (excitation 2) of the illumination lens 202 can be maintained to be the same state (lowered state) as that of FIG. 6B by this operation. Therefore, according to the first embodiment, the convergence half angle can be made smaller than the limiting point due to magnetic saturation, etc.

Next, the reason for setting the first crossover position to be the central height position of the blanking deflector 212 is described below.

If the DAC amplifier 122 for blanking control is unstable, voltage may change when the beam is on. For example, there occurs a voltage change of several mV (e.g., ±5 mV), or a larger voltage change may occur. The electron beam 200 passing through the blanking deflector 212 is deflected by such change.

Figures 7A, 7B:
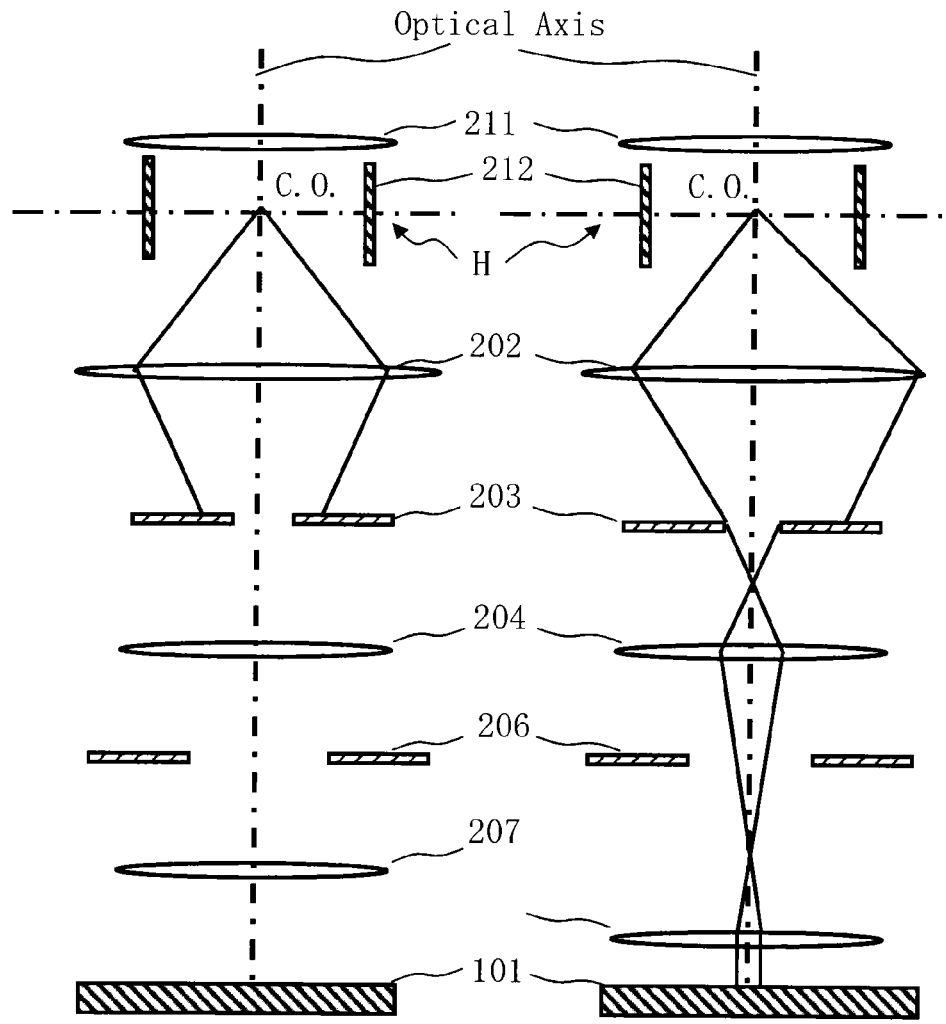
FIGS. 7A and 7B are conceptual diagrams showing comparison between a blanking voltage change and no blanking voltage change when a crossover position is set to the center height position of a blanking deflector according to the first embodiment.

FIGS. 7A and 7B are conceptual diagrams showing comparison between a blanking voltage change and no blanking voltage change when a crossover position is set to the center height position of the blanking deflector according to the first embodiment. FIG. 7A shows the case where a blanking voltage (e.g., 0V), in the beam-on state, is applied to the blanking deflector 212 and no voltage change (or a change of an ignorable extent) occurs in the blanking voltage. Moreover, FIG. 7A shows the case where no beam deflection, other than a blanking operation, is performed by the deflector 205 for shaping, the sub deflector 209, and the main deflector 208, and the beam passes along the optical axis, for example. In FIG. 7A, the electron beam 200 emitted from the electron gun 201 (emission unit) is controlled by the electron lens 211 to form a convergence point (crossover: C.O.) at the center height position H of the blanking deflector 212. Since it is in the beam-on state in this case, the electron beam 200 passes without being blocked by the blanking deflector 212. The optical path of the crossover system is shown in FIG. 7A. The electron beam which has passed through the blanking deflector 212 illuminates the whole of the first shaping aperture plate 203 by the illumination lens 202. Then, the electron beam 200 of the first aperture image which has passed through the first shaping aperture plate 203 is projected to the opening formed in the second shaping aperture plate 206 by the projection lens 204. The electron beam 200 of the second aperture image which has passed through the second shaping aperture plate 206 is focused to form an image on the surface of the target object 101 by the objective lens 207. In this configuration, the electron beam 200 perpendicularly enters the surface of the target object 101. In other words, the beam incident angle θ is 0°.

FIG. 7B shows the state, changed from the state of FIG. 7A, where a voltage change in the extent not to trigger a beam-off state occurs in the blanking voltage to be applied to the blanking deflector 212. As shown in FIG. 7B, the beam is deflected at the center height position H of the blanking deflector 212 by a change of the blanking voltage. However, when the crossover position is set to the center height position of the blanking deflector 212, even if a blanking voltage change occurs, the electron beam 200 enters the surface of the target object 101 at an angle substantially equivalent to a perpendicular incidence. In other words, it is possible to make the beam incident angle θ be approximately 0°. In this configuration, since the crossover position does not deviate from the optical axis, the electron beam 200 can perpendicularly enter the surface of the target object 101.

Figures 8A, 8B:
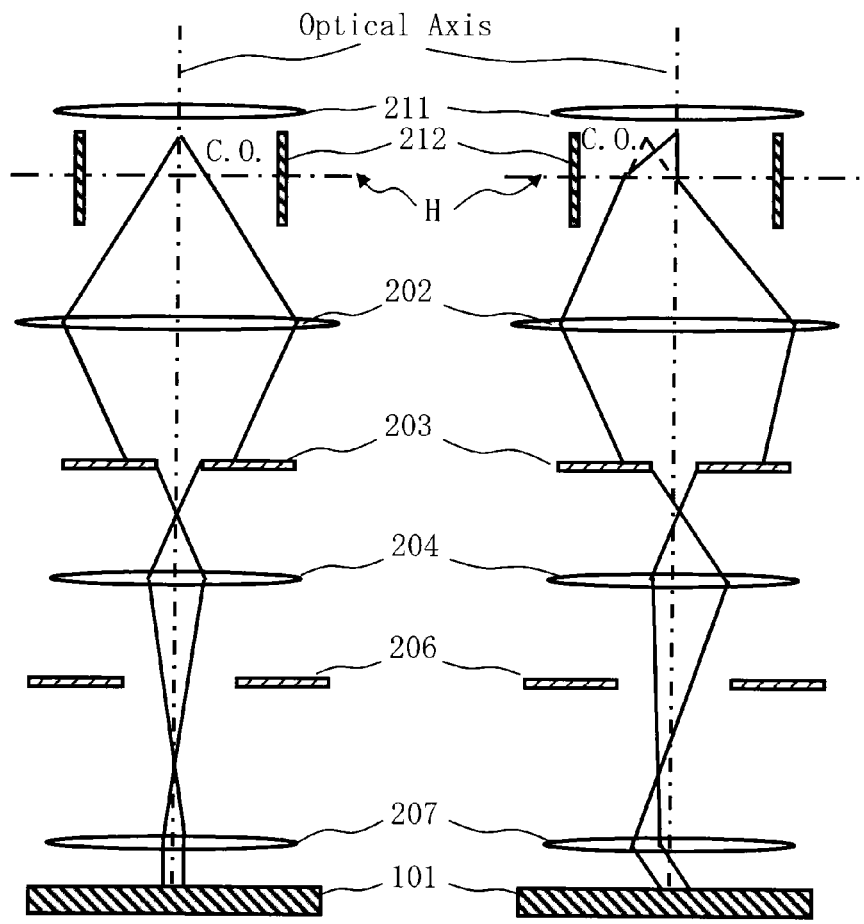
FIGS. 8A and 8B are conceptual diagrams showing comparison between a blanking voltage change and no blanking voltage change when a crossover position is controlled to be deviated from the center height position of a blanking deflector according to the first embodiment.

FIGS. 8A and 8B are conceptual diagrams showing comparison between a blanking voltage change and no blanking voltage change when a crossover position is controlled to be deviated from the center height position of the blanking deflector according to the first embodiment. FIG. 8A shows the case where a blanking voltage (e.g., 0V), in the beam-on state, is applied to the blanking deflector 212 and no voltage change (or a change of an ignorable extent) occurs in the blanking voltage. Moreover, FIG. 8A shows the case where no beam deflection, other than a blanking operation, is performed by the deflector 205 for shaping, the sub deflector 209, and the main deflector 208, and the beam passes along the optical axis, for example. In FIG. 8A, the electron beam 200 emitted from the electron gun 201 (emission unit) is adjusted by the electron lens 211 to form a convergence point (crossover: C.O.) at a position higher than the center height position H of the blanking deflector 212, for example. Since it is in the beam-on state in this case, the electron beam 200 passes without being blocked by the blanking deflector 212. The optical path of the crossover system is shown in FIG. 8A. The electron beam which has passed through the blanking deflector 212 illuminates the whole of the first shaping aperture plate 203 by the illumination lens 202. Then, the electron beam 200 of the first aperture image which has passed through the first shaping aperture plate 203 is projected to the opening formed in the second shaping aperture plate 206 by the projection lens 204. The electron beam 200 of the second aperture image which has passed through the second shaping aperture plate 206 is focused to form an image on the surface of the target object 101 by the objective lens 207. In this configuration, since the crossover position does not deviate from the optical axis as described later, the electron beam 200 perpendicularly enters the surface of the target object 101. In other words, the beam incident angle θ is 0°.

FIG. 8B shows the state, changed from the state of FIG. 8A, where a voltage change in the extent not to trigger a beam-off state occurs in the blanking voltage to be applied to the blanking deflector 212. As shown in FIG. 8B, the beam is deflected at the center height position H of the blanking deflector 212 by a change of the blanking voltage. However, when the crossover position is controlled to be higher than the center height position H of the blanking deflector 212, if a blanking voltage change occurs, the electron beam 200 enters the surface of the target object 101 from the direction displaced from the perpendicular direction. In other words, the beam incident angle θ is not 0°. Consequently, in the defocused state, the beam irradiation position on the target object 101 deviates from a designed desired position. It means that, in FIG. 8B, from the point of view of the beam after deflection, the crossover position has apparently moved to the position of the broken line in the blanking deflector 212 from the position on the optical axis as described later.

Figure 9A:
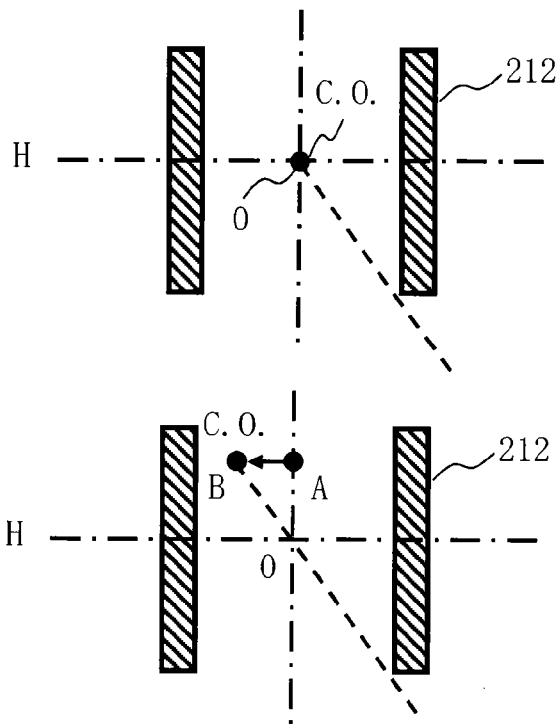
FIGS. 9A to 9D show a relation between a deflection fulcrum position and a crossover position at the time of blanking operation according to the first embodiment.
Figure 9B:
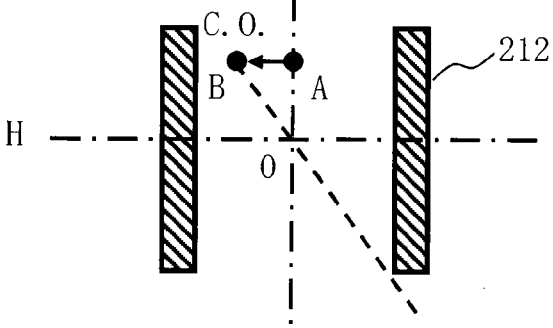
Figure 9C:
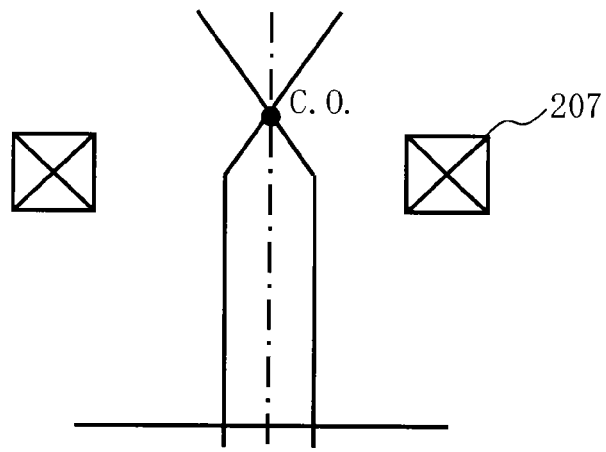
Figure 9D:
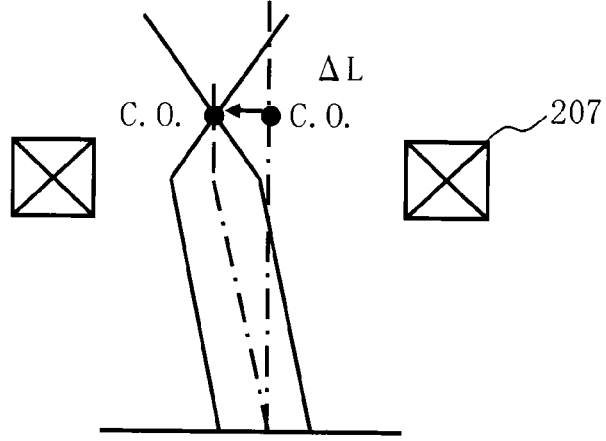
Figure 10:
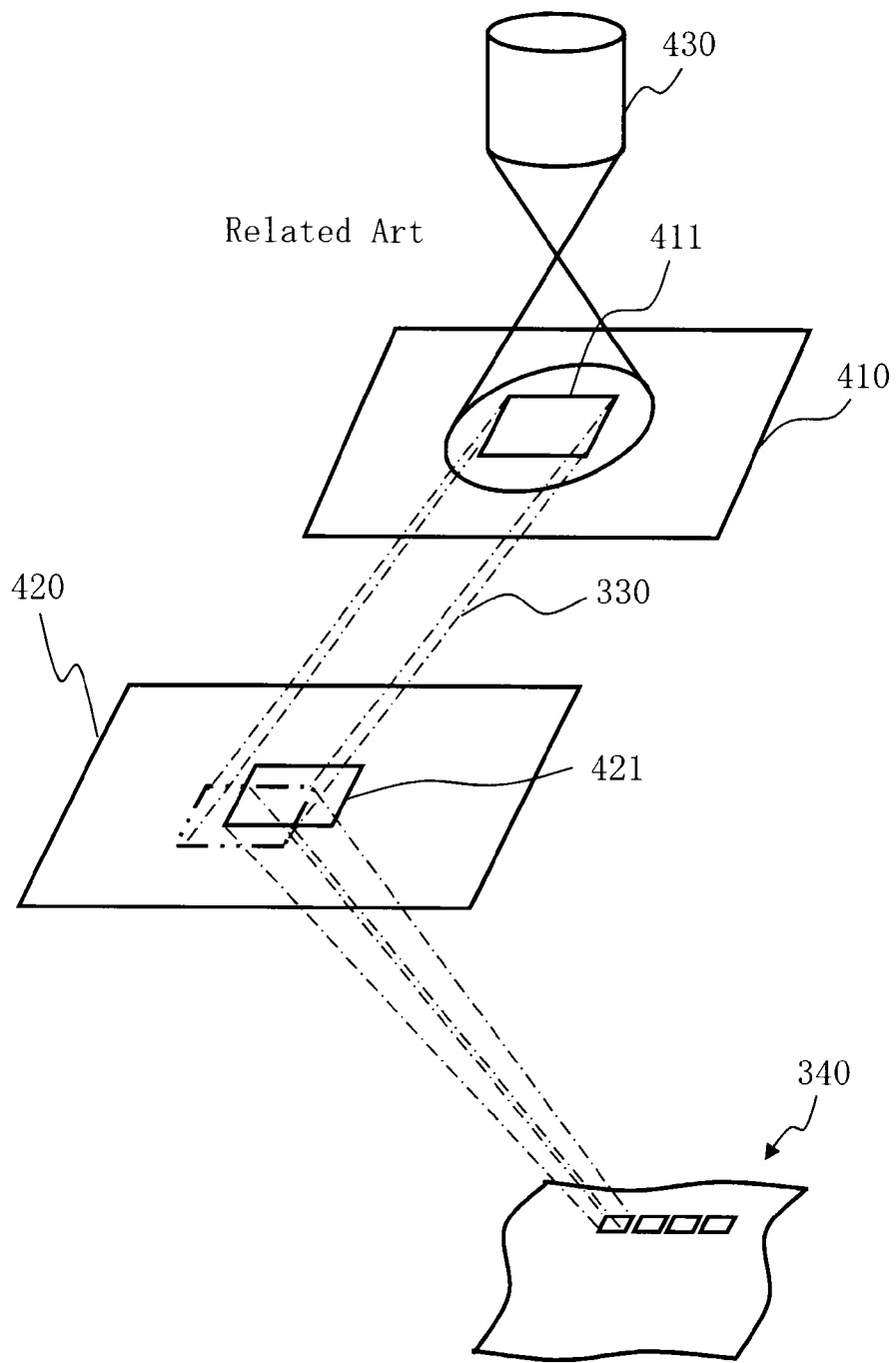
FIG. 10 is a conceptual diagram explaining operations of a variable shaped electron beam writing apparatus.

FIGS. 9A to 9D show a relation between the deflection fulcrum position and the crossover position at the time of the blanking operation according to the first embodiment. In FIG. 9A, it is adjusted to form a convergence point (crossover: C.O.), by the electron lens 211, at the center height position H of the blanking deflector 212. When a voltage is applied to the blanking deflector 212 and the electron beam 200 is deflected, the deflection fulcrum is located at the center height position H of the blanking deflector 212. When the crossover position is located at the center height position H of the blanking deflector 212, since the deflection fulcrum and the position are in accordance, the crossover position is on the optical axis. Therefore, as shown in FIG. 9C, the final crossover position is also formed at a position on the optical axis. On the other hand, as shown in FIG. 9B, when the crossover position deviates from the center height position H of the blanking deflector 212, the crossover position and the deflection fulcrum position do not accord with each other as shown in FIG. 9B. As described above, since the deflection fulcrum is located at the center height position H of the blanking deflector 212, from the point of view of the beam after deflection, the crossover position is apparently on the extended line of both the beam trajectory after deflection and the deflection fulcrum. Therefore, it means that the crossover position has moved to the position of the point B from the position of the point A on the optical axis. In other words, the crossover position is formed at the position displaced from the optical axis. As shown in FIG. 9D, the final crossover position of the beam is located at the position displaced from the optical axis by ΔL. Therefore, the beam deflected by the change of the blanking voltage enters the target object 101 at a beam incident angle θ which is not a perpendicular incidence (θ=0). Consequently, when the focus position is displaced (when defocused), the center position of the irradiating beam deviates from a designed desired position. On the other hand, as shown in FIG. 8A, in the state where there is no change of blanking voltage, since the deflection fulcrum is not formed at all in the blanking deflector 212, the crossover position can be on the optical axis. Therefore, in such a case, the beam enters the target object 101 at a perpendicular incidence (θ=0). In the example described above, the crossover position deviates higher from the center height position H of the blanking deflector 212. However, even when it deviates downward, the result that the final crossover position of the beam is displaced from the optical axis can also be obtained.

Then, according to the first embodiment, the electron lens 211 is adjusted so that a crossover position may be located at the center height position of the blanking deflector 212 in order to adjust a beam incident angle.

As described above, according to the first embodiment, it is possible to improve the resolution higher than the conventional one. Furthermore, it is possible to perform writing processing putting emphasis on the throughput and writing processing putting emphasis on the resolution.

The embodiment has been explained referring to concrete examples described above. However, the present invention is not limited to these specific examples. In the above examples, by setting the first crossover position after passing through the electron lens 211 before and after adjusting the height of the electron gun to be the same central height position of the blanking deflector 212, it is possible not to alter the subsequent optical conditions. However, it is not limited thereto. It is not necessary to limit the apparatus to have a crossover position at the center of the blanking deflector. The optical conditions and the crossover position may be changed. In that case, the position of the blanking deflector can also be arbitrary, and if there is a margin in adjustment of the optical system after the crossover position, the convergence half angle can further be smaller than that in the case of fixing the crossover position, by adjusting the height position of the electron gun system simultaneously with increasing the excitation of the electron lens 211 as shown in FIG. 6A to 6C.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus, method for adjusting a convergence half angle of an electron beam, and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam writing apparatus comprising:
   an electron gun system configured to emit an electron beam;
   a height adjustment unit arranged at a downstream side compared to the electron gun system with respect to an optical axis direction and configured to variably adjust a height position of the electron gun system;
   an electron lens arranged at the downstream side compared to the height adjustment unit with respect to the optical axis direction and configured to converge the electron beam;
   a lens control unit configured to control, for each variably adjusted and changed height position of the electron gun system, the electron lens such that the electron beam forms a crossover at a predetermined position; and
   an objective lens arranged at the downstream side compared to the electron lens with respect to the optical axis direction and configured to focus the electron beam having passed the electron lens.

2. The apparatus according to claim 1, wherein the height adjustment unit includes a plurality of spacer members.

3. The apparatus according to claim 2, wherein thicknesses in height of the plurality of spacer members are different from each other.

4. The apparatus according to claim 1, wherein the height adjustment unit includes an elastic piping and an elevating mechanism that elevates the electron gun system.

5. The apparatus according to claim 1 further comprising:
a blanking deflector arranged between the electron lens and the objective lens and configured to perform blanking deflection of the electron beam having passed the height adjustment unit.

6. The apparatus according to claim 5, wherein the lens control unit controls the electron lens such that the electron beam forms the crossover at a central height position of the blanking deflector by the electron lens.

7. The apparatus according to claim 1, further comprising:
an electron optical column in which the electron lens and the objective lens are arranged, wherein
the height adjustment unit is arranged on the electron optical column.

8. The apparatus according to claim 7, wherein the height adjustment unit supports the electron gun system.

9. A method for adjusting a convergence half angle of an electron beam comprising:
changing a height position of an electron gun system that emits an electron beam; and
adjusting a crossover height position of the electron beam emitted from the electron gun system and having passed through the electron lens to be a crossover height position of an electron beam before changing the height position of the electron gun system.

10. A method for adjusting a convergence half angle of an electron beam comprising:
adjusting a height position of an electron gun system that emits an electron beam to be a first position when a first writing mode is selected;
adjusting a crossover height position of the electron beam emitted from the electron gun system and having passed through an electron lens to be a second position when the first writing mode is selected;
adjusting the height position of the electron gun system to be a third position higher than the first position with respect to an optical axis direction when the first writing mode is switched to a second writing mode; and
making an adjustment to maintain the crossover height position of the electron beam emitted from the electron gun system and having passed through the electron lens to be the second position when the second writing mode is selected.

* * * * *